United States Patent
Hasnat et al.

(10) Patent No.: US 10,804,280 B2
(45) Date of Patent: Oct. 13, 2020

(54) MEMORY DEVICE WITH VERTICAL STRING DRIVERS

(71) Applicant: Intel Corporation, Santa Clara, CA (US)

(72) Inventors: Khaled Hasnat, San Jose, CA (US); Prashant Majhi, San Jose, CA (US); Deepak Thimmegowda, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 32 days.

(21) Appl. No.: 16/122,266

(22) Filed: Sep. 5, 2018

(65) Prior Publication Data

US 2019/0043873 A1    Feb. 7, 2019

(51) Int. Cl.

| | |
|---|---|
| *H01L 27/11529* | (2017.01) |
| *H01L 27/11573* | (2017.01) |
| *H01L 29/786* | (2006.01) |
| *H01L 27/11531* | (2017.01) |
| *H01L 27/11582* | (2017.01) |
| *H01L 27/11524* | (2017.01) |
| *H01L 27/1157* | (2017.01) |
| *H01L 27/11556* | (2017.01) |
| *H01L 27/11565* | (2017.01) |
| *H01L 27/11575* | (2017.01) |

(52) U.S. Cl.
CPC .... *H01L 27/11529* (2013.01); *H01L 27/1157* (2013.01); *H01L 27/11524* (2013.01); *H01L 27/11531* (2013.01); *H01L 27/11556* (2013.01); *H01L 27/11565* (2013.01); *H01L 27/11573* (2013.01); *H01L 27/11575* (2013.01); *H01L 27/11582* (2013.01); *H01L 29/7869* (2013.01); *H01L 29/78642* (2013.01)

(58) Field of Classification Search
CPC ................................................. H01L 27/11529
See application file for complete search history.

(56) References Cited

U.S. PATENT DOCUMENTS

| | | | | |
|---|---|---|---|---|
| 8,188,517 | B2 * | 5/2012 | Choi ................... | G11C 16/0483 257/211 |
| 8,912,589 | B2 * | 12/2014 | Wang .................. | H01L 29/7889 257/324 |
| 2002/0089020 | A1 * | 7/2002 | Clevenger ........... | H01L 21/2251 257/382 |
| 2010/0226195 | A1 * | 9/2010 | Lue ..................... | H01L 27/0688 365/230.06 |

(Continued)

*Primary Examiner* — William A Harriston
(74) *Attorney, Agent, or Firm* — Schwabe, Williamson & Wyatt, P.C.

(57) ABSTRACT

Embodiments of the present disclosure are directed towards a memory device with vertical string drivers, in accordance with some embodiments. In one embodiment, the memory device includes a plurality of wordlines formed in a stack of multiple tiers. The device further includes a semiconductor layer disposed on top of the plurality of wordlines. The device further includes a plurality of string drivers disposed in the semiconductor layer substantially perpendicular to the tier stack of the plurality of wordlines. The semiconductor layer provides respective gate connections for the plurality of string drivers. In some embodiments, the semiconductor layer may be fabricated of polysilicon. Other embodiments may be described and/or claimed.

15 Claims, 7 Drawing Sheets

(56) References Cited

U.S. PATENT DOCUMENTS

2011/0284946 A1* 11/2011 Kiyotoshi ......... H01L 27/11565
257/324
2013/0049096 A1* 2/2013 Wang .................. H01L 29/7889
257/324

* cited by examiner

MEMORY DEVICE WITH VERTICAL STRING DRIVERS

FIELD

Embodiments of the present disclosure generally relate to the field of integrated circuits, and more particularly, to fabrication techniques for a non-volatile memory device.

BACKGROUND

A typical flash memory device may comprise a memory array that includes a large number of non-volatile memory cells arranged in row and column fashion. In recent years, vertical memory, such as three-dimensional (3D) memory, has been developed in various forms, such as NAND, NOR, cross-point, or the like. A 3D flash memory array may include a plurality of memory cells stacked over one another. Each group of memory cells may share a plurality of access lines, known as wordlines and bitlines.

In NAND memory technology, particularly in 3D NAND memory technology, connection between string driver transistors (wordline drivers) and respective wordlines is an important architecture decision, which affects the 3D NAND die area, die performance and system metrics. String driver transistors need to support high voltages and break down condition and occupy a significant area of the 3D NAND die. The memory tile based architecture on 3D NAND further increases the total string driver area in the die. In general, disposition of the string driver transistors affects the contact area availability and block height dimensions in a flash memory device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for a memory device with vertical string drivers, in accordance with some embodiments. In embodiments, the memory device includes a plurality of wordlines formed in a stack of multiple tiers. The device further includes a semiconductor layer disposed on top of the plurality of wordlines. The device further includes a plurality of string drivers disposed in the semiconductor layer substantially perpendicular to the tier stack of the plurality of wordlines. The semiconductor layer provides respective gate connections for the plurality of string drivers. In some embodiments, the semiconductor layer may be fabricated of polysilicon.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Figure 1:
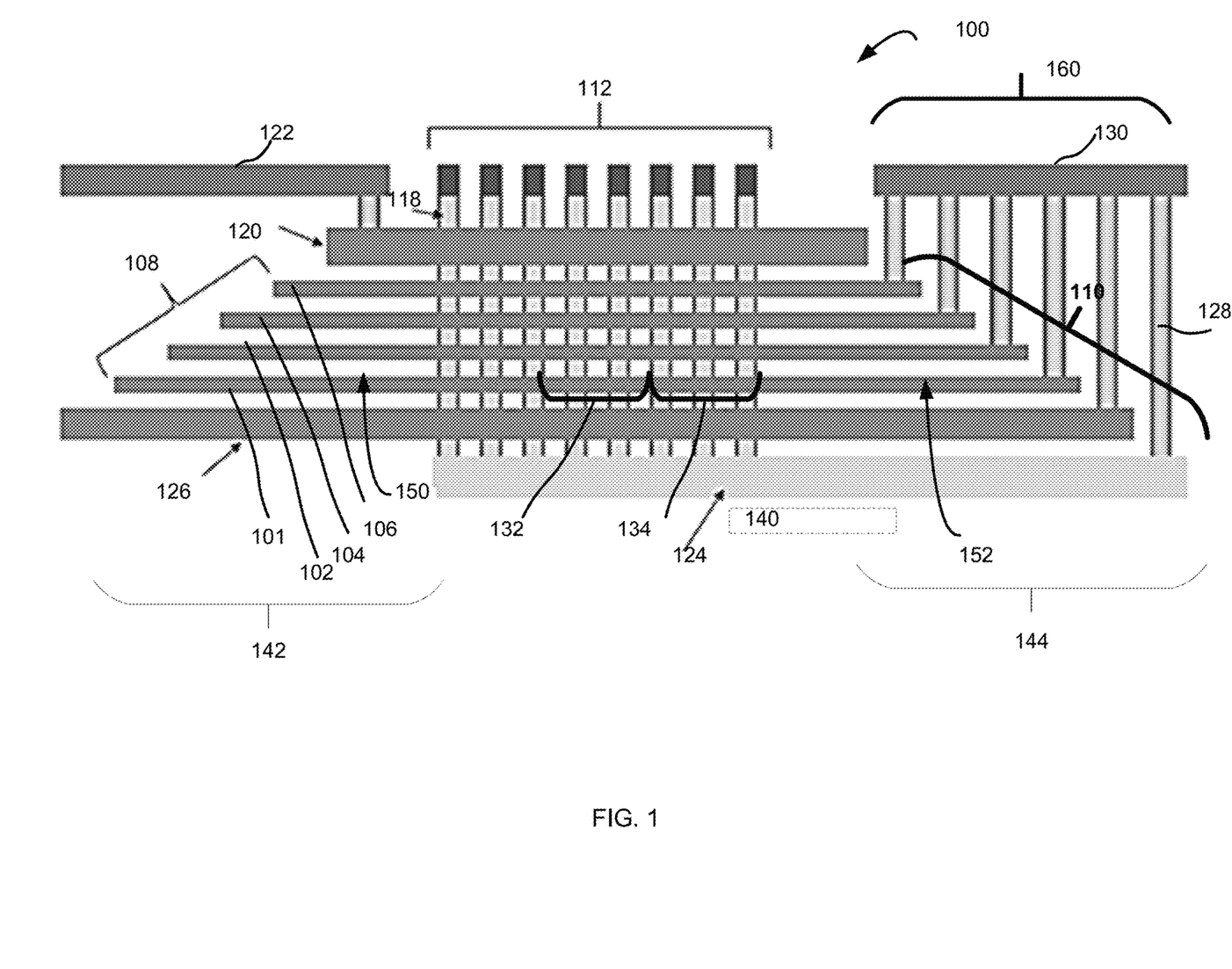
FIGS. 1-2 are example cross-section and perspective views of a memory device with vertical string drivers, in accordance with some embodiments.
Figure 2:
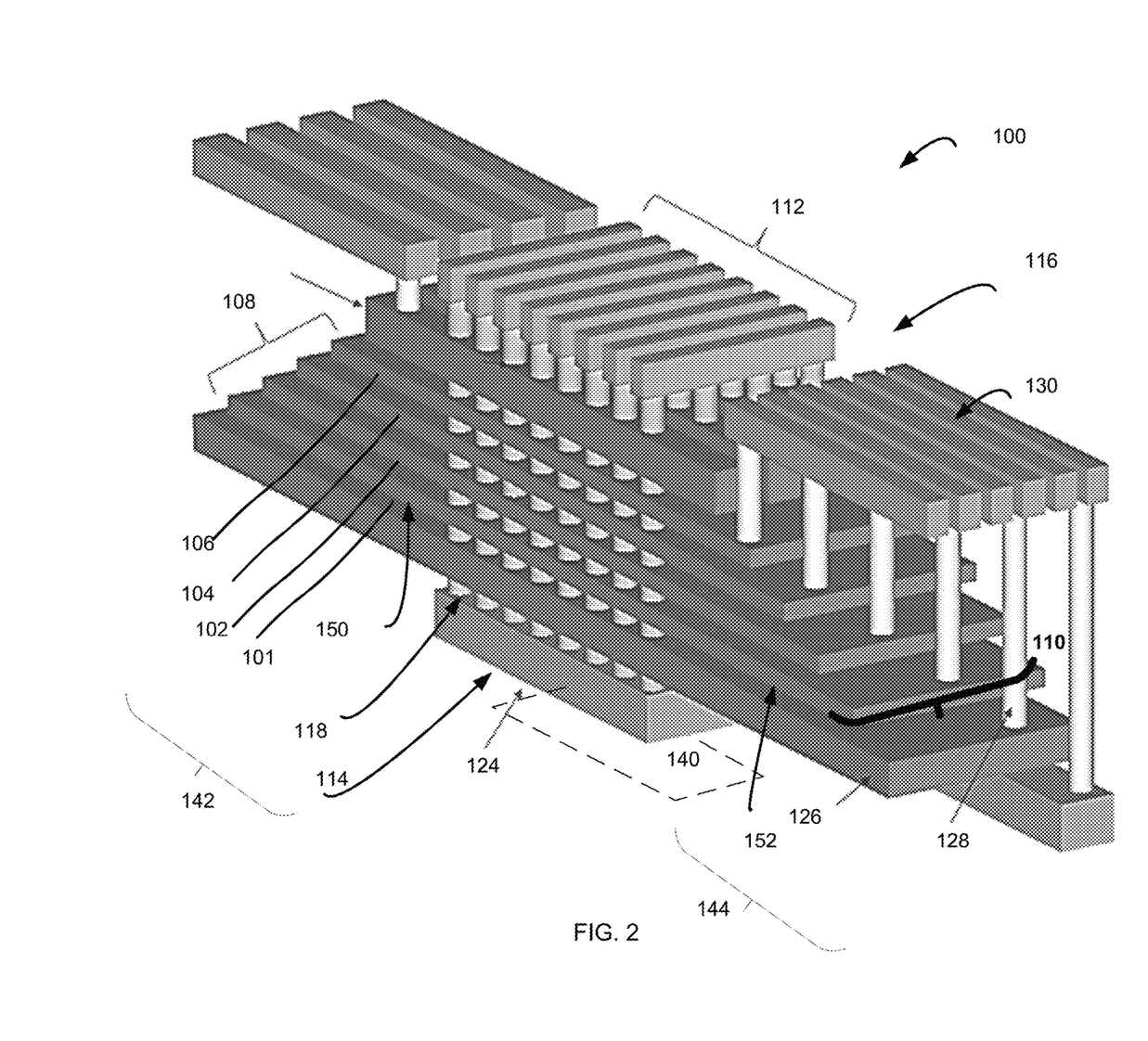

FIGS. 1-2 are example cross-section and perspective views of a memory device with vertical string drivers, in accordance with some embodiments. In embodiments, the memory device 100 is a non-planar device (e.g., 3D) and includes a non-volatile memory device. The memory device 100 may be a flash memory device, such as a NAND flash or a NOR flash memory device, or another kind of memory device, e.g., multilevel cell (MLC) memory device. In embodiments, the memory device 100 may be implemented as an integrated circuit (IC), e.g., in a die.

The memory cells comprising the memory device 100 include non-volatile memory cells, such that the memory cells retain information stored thereon when power is disconnected from memory device 100. In embodiments, the memory device 100 includes memory cells (not shown), which may be arranged in memory cell strings. The memory cells of a given memory cell string share a common channel region. In other words, the memory cells may be physically located in multiple levels of memory device 100, such that the memory cells in the same memory cell string may be stacked over each other in multiple levels of memory device 100, forming pillars. For simplicity, only one of the pillars is labeled (118) in FIGS. 1-2.

In embodiments, the memory device 100 includes wordlines 101, 102, 104, 106 that carry corresponding control signals and may form at least part of access lines of memory device 100. In embodiments, the memory device 100 includes data lines or bitlines 112 that carry corresponding data signals. Wordlines 101, 102, 104, 106 and bitlines 112 are shown in FIGS. 1-2 as an illustrative example only. The number of these lines may vary. In some embodiments, the bitlines and wordlines may be configured such that each of the memory elements may be disposed at an intersection of each individual bitline and wordline, in a cross-point configuration.

As shown, the wordlines 101, 102, 104, 106 may be formed in a stack of multiple wordline tiers and may form staircases 108, 110 on respective left and right sides of the memory device 100, to couple with respective pillars 118 as shown. Two staircases 108, 110 are shown in FIGS. 1-2 for ease of understanding. It should be understood that the memory device may have staircases formed on front side 114 and back side 116 of the memory device 100 (indicated in FIG. 2), in addition or in the alternative to the staircases 108, 110 formed on left and right sides 142 and 144 of the memory device 100. The staircase structure may be provided by trimming an etching the wordlines.

In embodiments, the memory device 100 includes a bit line selector 120 with corresponding connections 122, to select bit lines. The memory device 100 further includes a common source line 124 of the memory device 100, with corresponding source line selector 126. Contacts 128 provide electrical contacts for the wordline (e.g., common gate), source line, and source line selector connections layer 130, as shown. The layer 130 provides transistors on top of the pillars to turn on certain pillars, and is known as select gate drain (SGD) layer.

One of ordinary skill in the art may recognize that memory device 100 may include other elements, several of which are not shown in FIGS. 1-2, so as not to obscure the example embodiments described herein.

In a memory operation, for example, in a write operation, different voltages may be applied to wordlines 101, 102, 104, 106 to selectively access memory cells located in pillars (e.g., 118) in order to store information into one or more selected memory cells. Circuitry including a control circuit (not shown) may control operations of device 100 based on signals provided to the control circuit. A processing device (e.g., a processor or a memory controller, not shown) external to memory device 100 may send different commands (e.g., read, write, program verify, erase or command) to the memory device 100 via the control circuit. The control circuit may respond to commands to perform memory operations of accessing a memory cells, such as a read operation to read information from memory cells and a write (e.g., programming) operation to store (e.g., program) information into memory cells. The control circuit may also perform an erase operation to clear information from some or all of memory cells.

In embodiments, the memory device 100 may comprise one or more memory blocks or tiles (each having a plurality of memory cells) disposed in a die, such as a NAND die, for example. A memory block may have different memory capacities, depending on technological demand. In operation, such as when the memory device 100 is to be accessed for data erasure, data programming, or data reading, a memory block may be selected (e.g., for erasure, programming, or reading) or deselected, in order to refrain from erasing, programming, or reading deselected blocks while the selected blocks are being erased, programmed, or read. During various operations, the control circuit may cause various memory blocks (groups of memory cells) to be selected or deselected. Accordingly, in a memory array having a plurality of memory blocks, at least one block may be selected for access (e.g., for a program mode or read mode), while other blocks may be deselected in order to refrain from access.

In order to provide a division of the memory device into memory blocks, or tiles, the memory array (e.g., wordlines 108) may be divided into segments, e.g., segments 132 and 134 shown in FIG. 2, each segment covering a particular memory volume (e.g., 2 KB bitlines). (Such memory architecture is known as a memory tile structure.) In embodiments, neighboring tiles may be connected through metal interconnects and have shared string drivers and other necessary circuitry, typically disposed underneath the array. Such circuitry comprises complementary metal-oxide-semiconductor (CMOS) under array circuitry (CUA), schematically shown as 140 in FIGS. 1-2. In a memory device 100 with tile based architecture, the string driver transistors and corresponding circuitry may be disposed in the CUA area 140. According to embodiments described below in greater detail, the string drivers may be moved away from the CUA area 140 and disposed on top of staircase contacts 128, e.g., in the area indicated by bracket 160.

Figure 3:
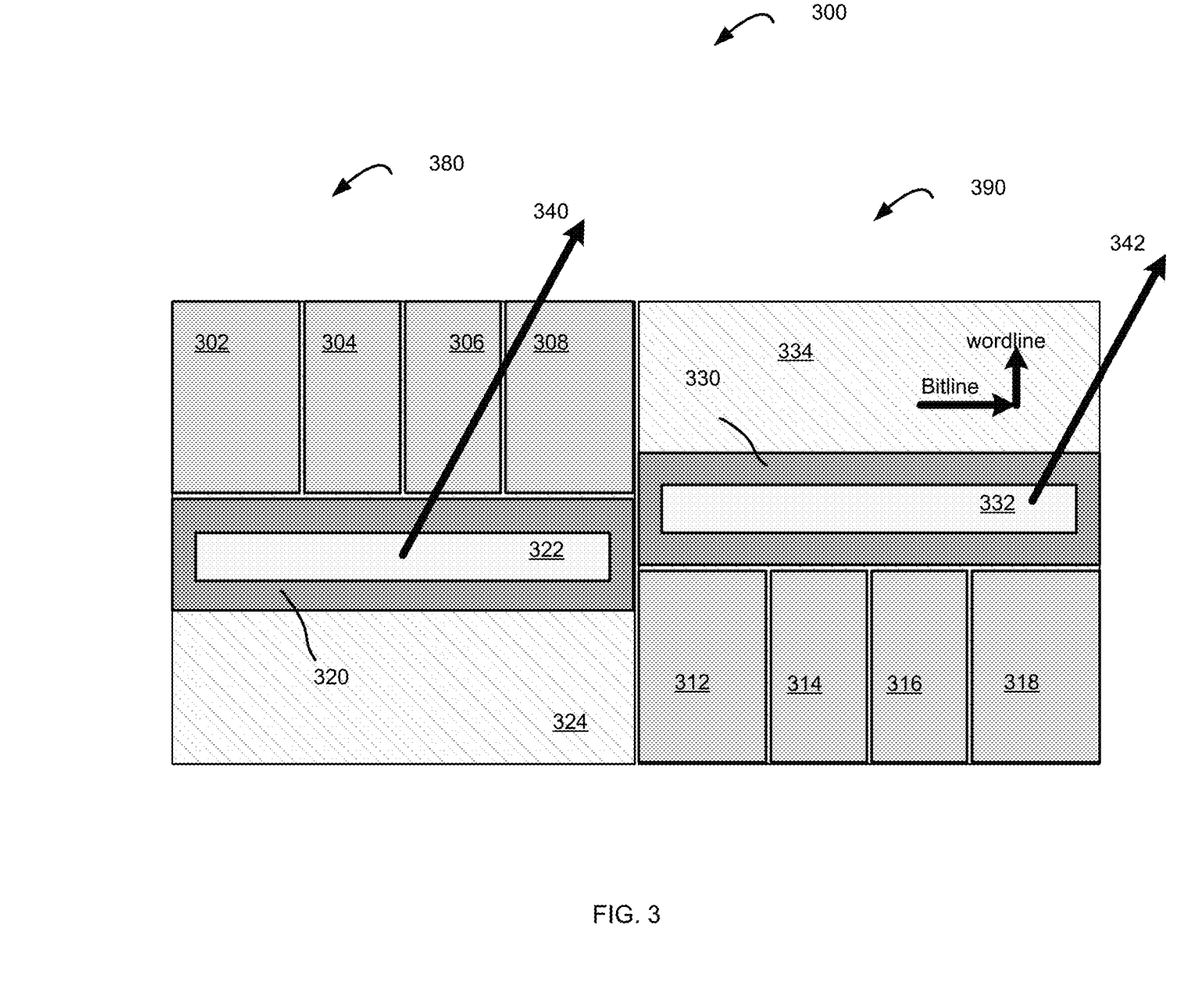
FIG. 3 illustrates an example tile architecture layout of a memory device, in accordance with some embodiments.

FIG. 3 illustrates an example tile architecture layout of a memory device, in accordance with some embodiments. In embodiments, the memory device 300 (provided similar to the device 100) may include multiple memory tiles (e.g., 380 and 390), connected via a plurality of wordlines. Two tiles are shown for purposes of explanation; it should be understood that the memory device 300 (100 of FIGS. 1-2) may comprise any number of memory tiles.

As shown, the tile architecture comprises a number of page buffers 302, 304, 306, 308 in the tile 380. Similarly, page buffers 312, 314, 316, 318 are disposed in the neighboring tile 390. The CUA circuitry is disposed in the device 300 as shown and is indicated by numerals 320 and 340.

Typically, the neighboring tiles 304 and 306 share a string driver, so they should be connected (shorted). In conventional solutions, such connections may be provided via metal routing. The string drivers 322 and 332 may be positioned in the tiles 304 and 306 as shown in FIG. 3.

In general, in vertical NAND flash memory device with tile based architecture, the string driver transistors need to be placed at the intersection of every tile group (to account for the wordline resistance). This makes the string driver area fairly congested. The string driver circuits are typically placed under the array (in the CUA area). As the number of wordline tiers increases, the total string driver area grows, which may impact a die size for CUA-based memory devices. For example, a string driver may occupy 8-10 percent of the CUA die space in the tile architecture where page buffers are disposed on one half of the tile and string drivers block entry on the other side of the CUA area. In non-CUA-based memory devices, the string drivers may also occupy substantial space in the die.

As shown in FIG. 3, the string drivers 322 and 332 may block the metal entry for much of the tile area (e.g., 324, 334), which may cause inefficiencies in the CUA space, such as lack of space for routing, for example.

According to the embodiments described herein, the string drivers 322 and 332 may be moved away from the CUA die space (as indicated by arrows 340 and 342), in order to improve the overall CUA efficiency and save the CUA die space. More specifically, according to the embodiments described herein, the string driver area may be scaled by removing string driver transistors from the CUA space and vertically build the string drivers on top of the staircase contacts of the memory device 100 (300).

Figure 4:
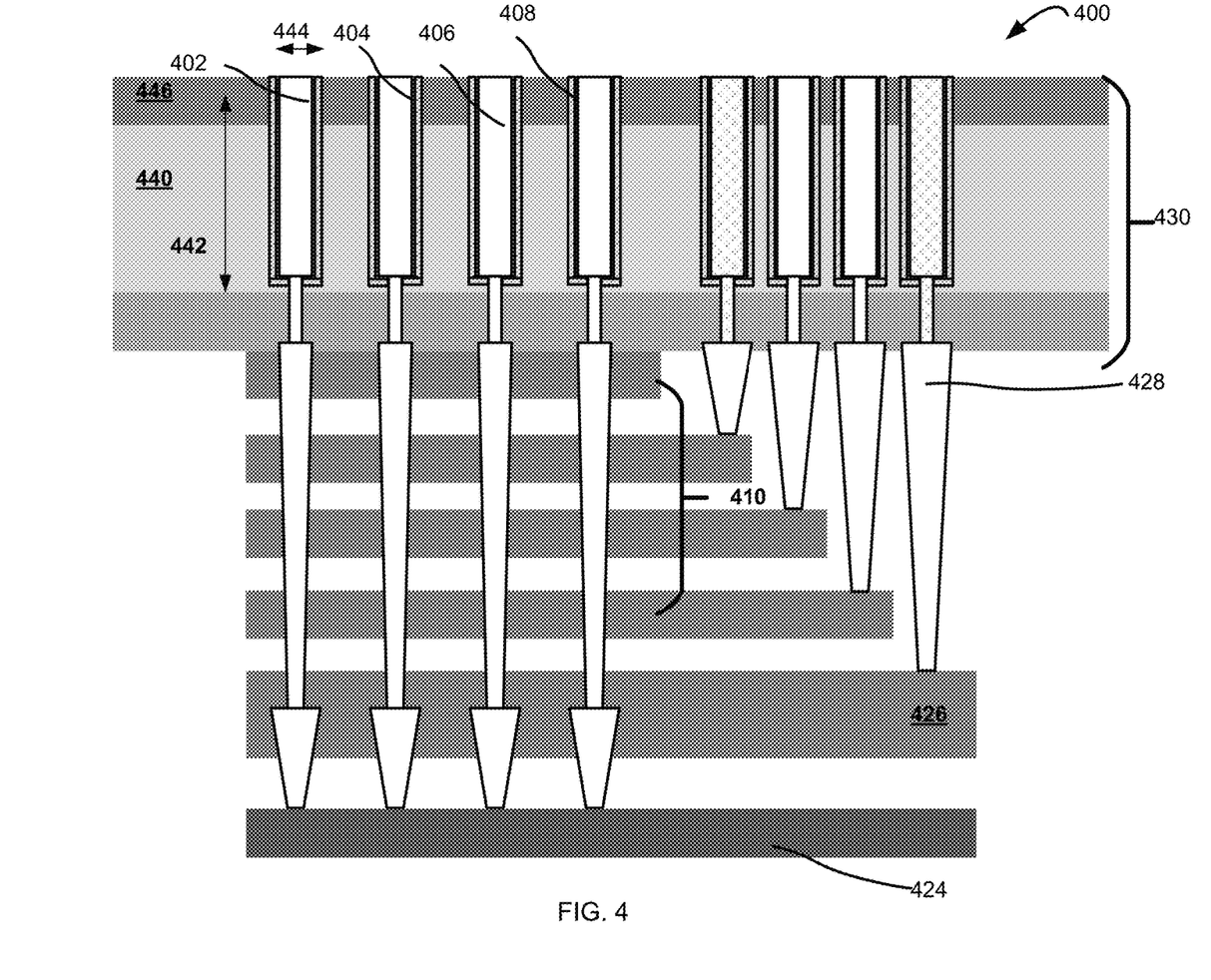
FIG. 4 provides example cross-section view of some aspects of the memory device with vertical string drivers, in accordance with some embodiments.

FIG. 4 provides example cross-section view of some aspects of the memory device with vertical string drivers, in accordance with some embodiments. The memory device 400 may be provided similar to the memory device 100 of FIGS. 1-2.

As shown, memory device 400 includes the staircase (wordlines) 410 (similar to 110 of FIGS. 1-2). A shown, the wordlines 410 are formed in a stack of multiple tiers. A semiconductor layer (SGD layer) 430 is formed on top of the wordlines 410. Contacts 428 (similar to 128) provide electrical contacts for the wordline (common gate) and source line (SGS source 426) layer, hereinafter SGD layer 430, similar to 130.

In embodiments, the vertical string drivers 402, 404, 406, 408 may be integrated in the SGD layer 430, to connect with the common source line 424 (similar to 124). For example, the string drivers 402, 404, 406, 408 are disposed in the semiconductor (SGD) layer 430 substantially perpendicular to the tier stack of the wordlines 410, as shown. The semiconductor layer 430 provides respective gate connections for the string drivers 402, 404, 406, 408. Four vertical string drivers are shown for ease of understanding; it is noted that any number of string driver transistor disposed according to the described embodiments may be contemplated.

The integration is done using the semiconductor material used for the fabrication of the SGD layer, for example, polysilicon. The thickness of the material required for accommodating the vertical string drivers 402, 404, 406, 408 may determine whether the string driver integration may be done using SGD polysilicon or a separate semiconductor (e.g., polysilicon) layer 440. The vertical string driver transistors 402, 404, 406, 408 may be integrated of this with the SGD polysilicon as a gate. Different gate oxides can be grown across SGD polysilicon and the vertical string drivers. The channel length 442 may comprise the height of the SGD polysilicon layer 400 and the channel width 444 may be determined as π*diameter of the string driver hole.

In summary, the connection for local wordlines may be on top of the staircase contact and the global wordline connection can be created using top level metal 446. Since the metal crowding and minimal pitch below the array (in the CUA area) is not needed for vertical drivers, the described embodiments provide for reduction or elimination a metal layer below the array, in addition to the area savings on the CUA die.

In embodiments, the vertical driver transistors may comprise wideband transistors. In some embodiments, the vertical driver transistors may comprise c-axis aligned crystalline indium gallium zinc oxide (CAAC-IGZO) transistors.

For example, the transistors may be chosen to support a length of 2000 A and contact diameter of about 300-500 nm.

Figure 5:
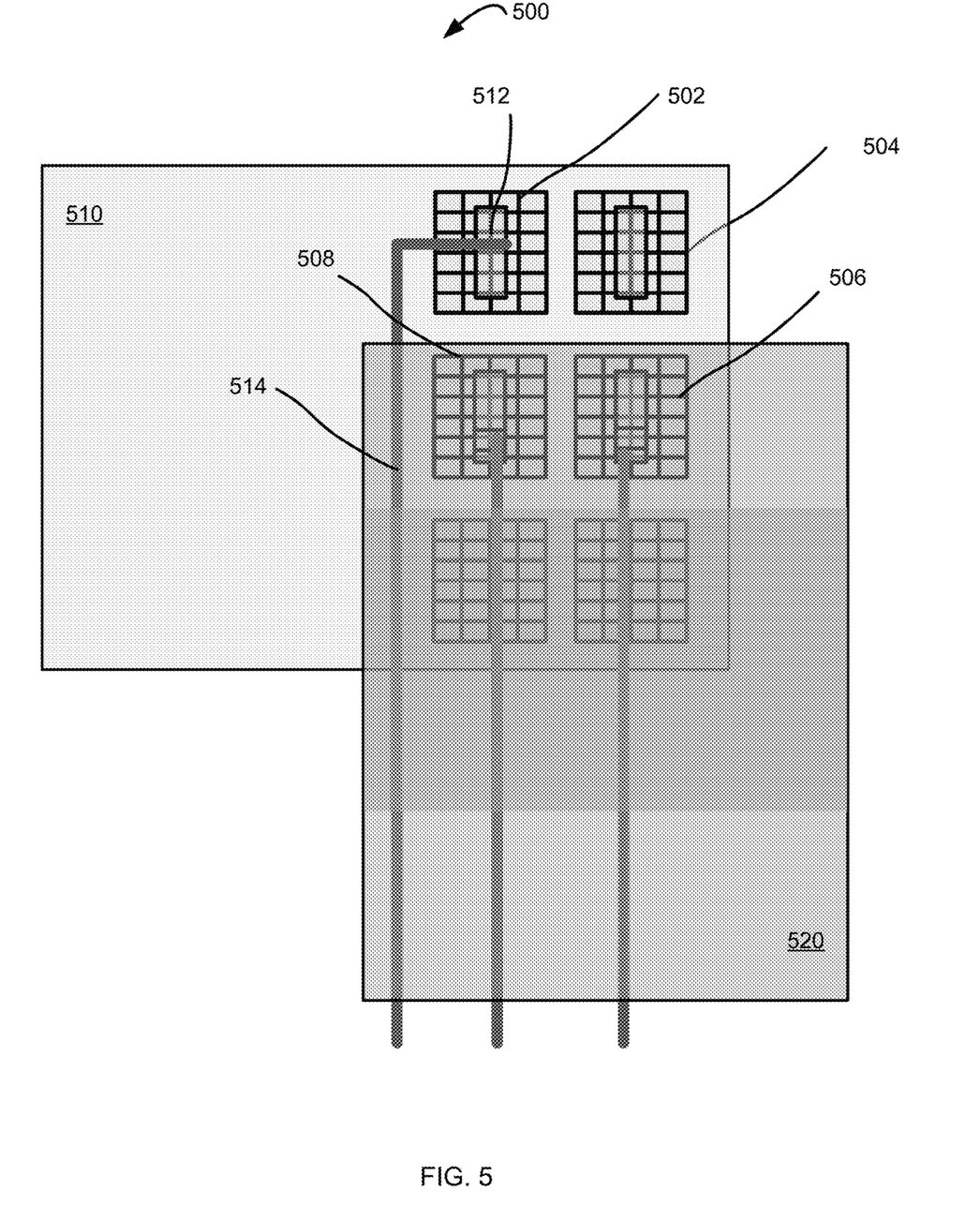
FIG. 5 is an example top view of some aspects of the memory device with vertical string drivers, in accordance with some embodiments.

FIG. 5 is an example top view of some aspects of the memory device with vertical string drivers, in accordance with some embodiments. More specifically, FIG. 5 illustrates the wordline routing of the vertical string drivers provided as described in reference to FIG. 4. The memory device 500 may be provided similar to the memory device 100 of FIGS. 1-2 and device 400 of FIG. 400.

As shown, the vertical string drivers 502, 504, 506, 508 may be disposed on top of the wordline staircase 510 in the SGD layer. A routing connection for the string drivers is disposed on top of respective control gate contacts for the plurality of wordlines, in order to control the control gate contacts. The local wordline connection is the source of the vertical string drivers 502, 504, 506, 508. The gate of the transistors (e.g., 512 of the driver 502) can be connected with a routing line (e.g., 514) provided in the wordline 520. The global wordline (GWL) connection can be the drain of the vertical transistor with met1/met0p5 as the GWL connection.

Figure 6:
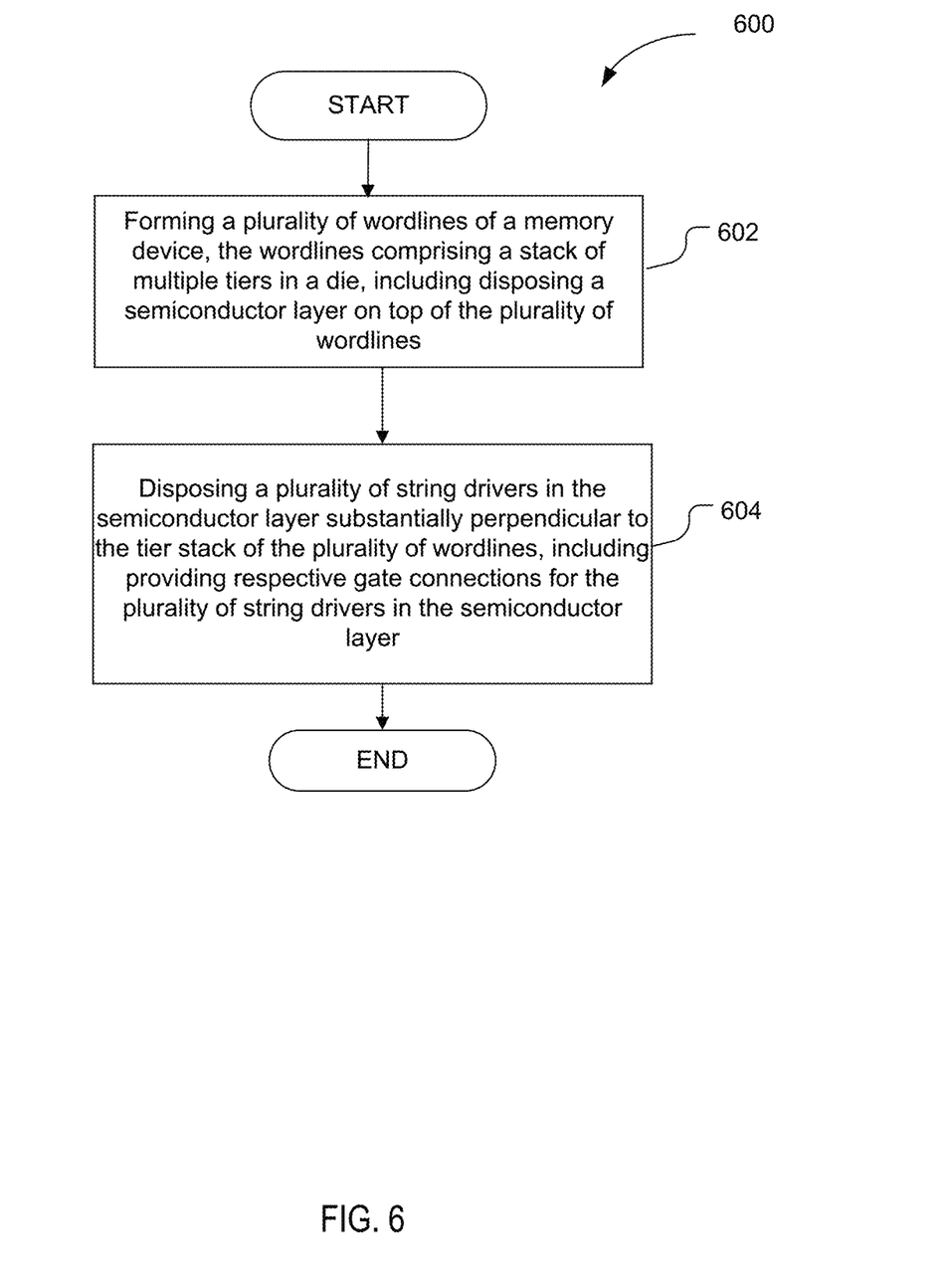
FIG. 6 is an example process flow diagram for providing a memory device with vertical string drivers, in accordance with some embodiments.

FIG. 6 is an example process flow diagram for providing a memory device with vertical string drivers, in accordance with some embodiments. The process 600 may comport with actions described in connection with FIGS. 1-5 in some embodiments. The process 600 may apply to formation of wordline connections in a memory array in accordance with embodiments described herein.

At block 602, the process 600 includes forming a plurality of wordlines of a memory device, the wordlines comprising a stack of multiple tiers in a die. This may include disposing a semiconductor layer on top of the plurality of wordlines.

At block 604, the process 600 includes disposing a plurality of string drivers in the semiconductor layer substantially perpendicular to the tier stack of the plurality of wordlines. This may further include providing respective gate connections for the plurality of string drivers in the semiconductor layer. In embodiments, the semiconductor layer may comprise an SGD layer fabricated of polysilicon or other suitable semiconductor material.

Various operations of the process 600 are described as multiple discrete operations, in a manner that is most helpful in understanding the claimed subject matter. However, the order of description should not be construed as to imply that these operations are necessarily order dependent. It will be appreciated that the sequence of operations associated with the process 600 may vary and/or include other actions in accordance with the present disclosure. As noted, the described embodiments may be implemented in a three-dimensional memory array, such as a 3D NAND memory array.

The memory devices and methods described herein may be implemented into a system using any suitable hardware and/or software to configure as desired.

Figure 7:
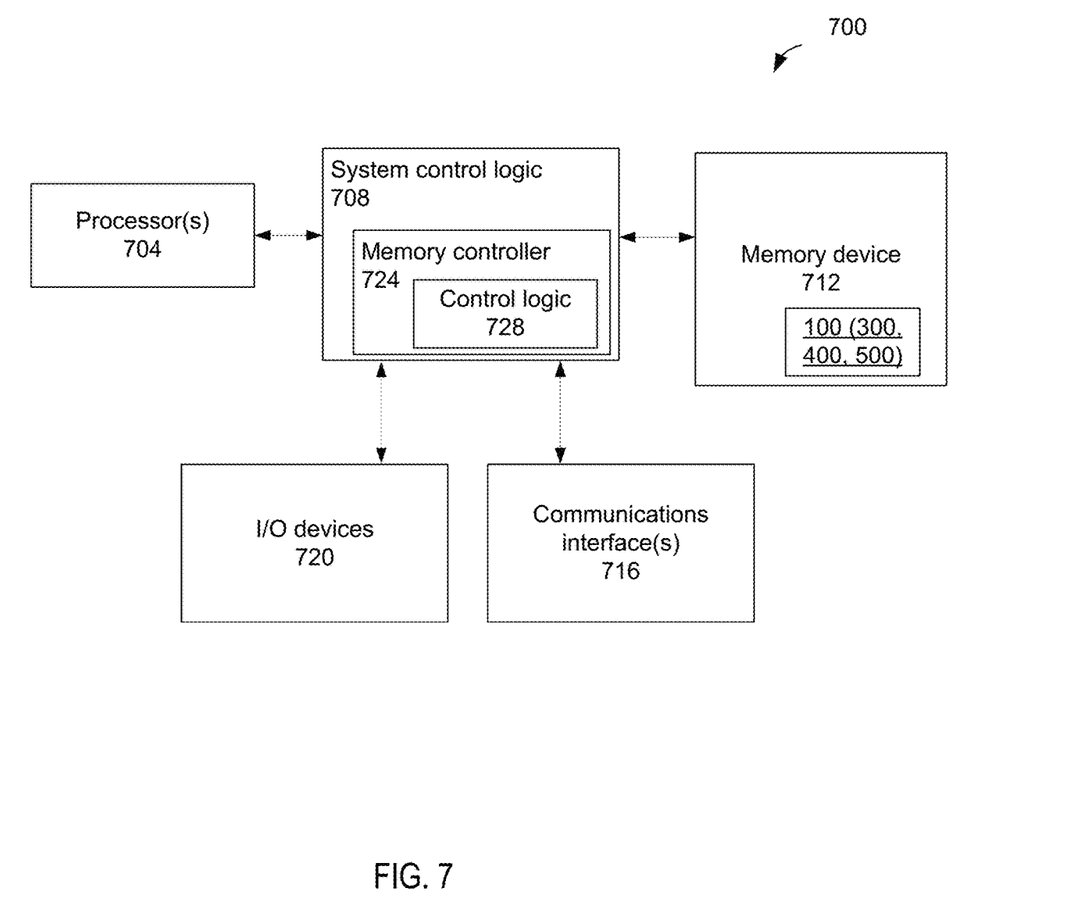
FIG. 7 schematically illustrates an example computing device including a memory device with vertical string drivers, in accordance with some embodiments.

FIG. 7 schematically illustrates an example computing device including a memory device with vertical string drivers, in accordance with some embodiments. The computing device 700 includes system control logic 708 coupled to one or more processor(s) 704; a memory device 712 having a memory device 300 (1000) described in reference to FIGS. 3-15; one or more communications interface(s) 716; and input/output (I/O) devices 720.

The memory device 712 may be a non-volatile computer storage chip (e.g., provided on the die) that may include the memory device 100 (400, 500) of FIGS. 1 and 4-5. In embodiments, the memory device 712 comprises a package, such as IC assembly having the memory device 100 (300, 400, or 500) disposed therein, driver circuitry (e.g., drivers), input/output connections to electrically couple the memory device 712 with other components of the computing device 700, etc. The memory device 712 may be configured to be removably or permanently coupled with the computing device 700.

Communications interface(s) 716 may provide an interface for computing device 700 to communicate over one or more network(s) and/or with any other suitable device. Communications interface(s) 716 may include any suitable hardware and/or firmware. Communications interface(s) 716 for one embodiment may include, for example, a network adapter, a wireless network adapter, a telephone modem, and/or a wireless modem. For wireless communications, communications interface(s) 716 for one embodiment may use one or more antennas to communicatively couple the computing device 700 with a wireless network.

For one embodiment, at least one of the processor(s) 704 may be packaged together with logic for one or more controller(s) of system control logic 708. For one embodiment, at least one of the processor(s) 704 may be packaged together with logic for one or more controllers of system control logic 708 to form a System in Package (SiP). For one embodiment, at least one of the processor(s) 704 may be integrated on the same die with logic for one or more controller(s) of system control logic 708. For one embodiment, at least one of the processor(s) 704 may be integrated on the same die with logic for one or more controller(s) of system control logic 708 to form a System on Chip (SoC).

System control logic 708 for one embodiment may include any suitable interface controllers to provide for any suitable interface to at least one of the processor(s) 704 and/or to any suitable device or component in communication with system control logic 708. The system control logic 708 may move data into and/or out of the various components of the computing device 700.

System control logic 708 for one embodiment may include a memory controller 724 to provide an interface to the memory device 712 to control various memory access operations. The memory controller 724 may include control logic 728 that may be specifically configured to control access of the memory device 712.

In various embodiments, the I/O devices 720 may include user interfaces designed to enable user interaction with the computing device 700, peripheral component interfaces designed to enable peripheral component interaction with the computing device 700, and/or sensors designed to determine environmental conditions and/or location information related to the computing device 700. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 716 to communicate with components of a positioning network, e.g., a global positioning system (GPS) satellite.

In various embodiments, the computing device 700 may be a mobile computing device such as, but not limited to, a laptop computing device, a tablet computing device, a netbook, a smartphone, etc.; a desktop computing device; a workstation; a server; etc. The computing device 700 may have more or fewer components, and/or different architectures. In further implementations, the computing device 700 may be any other electronic device that processes data.

According to various embodiments, the present disclosure describes a number of examples.

EXAMPLES

Example 1 is an apparatus, comprising: a plurality of wordlines formed in a stack of multiple tiers; a semiconductor layer disposed on top of the plurality of wordlines; and a plurality of string drivers disposed in the semiconductor layer substantially perpendicular to the tier stack of the plurality of wordlines, wherein the semiconductor layer provides respective gate connections for the plurality of string drivers.

Example 2 includes the apparatus of Example 1, wherein the semiconductor layer comprises a select gate drain (SGD) layer.

Example 3 includes the apparatus of Example 1, wherein the semiconductor layer comprises polysilicon.

Example 4 includes the apparatus of Example 1, wherein the plurality of string drivers comprise c-axis aligned crystalline indium gallium zinc oxide (CAAC-IGZO) transistors.

Example 5 includes the apparatus of Example 1, wherein the plurality of string drivers comprise wideband transistors.

Example 6 includes the apparatus of Example 1, wherein the apparatus is provided according to a complementary metal-oxide-semiconductor (CMOS) under array circuitry (CUA).

Example 7 includes the apparatus of Example 1, wherein routing connections for the plurality of string drivers are disposed on top of respective contacts for the plurality of wordlines.

Example 8 includes the apparatus of Example 1, wherein the apparatus comprises a three-dimensional (3D) NAND memory array.

Example 9 includes the apparatus of any of Examples 1 to 8, wherein the apparatus comprises an integrated circuit.

Example 10 is a computing system, comprising: a processor; and a memory coupled with the processor, wherein the memory includes: a plurality of wordlines formed in a stack of multiple tiers; a semiconductor layer disposed on top of the plurality of wordlines; and a plurality of string drivers disposed in the semiconductor layer substantially perpendicular to the tier stack of the plurality of wordlines, wherein the semiconductor layer provides respective gate connections for the plurality of string drivers.

Example 11 includes the computing system of Example 10, wherein the semiconductor layer comprises a select gate drain (SGD) layer.

Example 12 includes the computing system of Example 10, wherein the semiconductor layer comprises polysilicon.

Example 13 includes the computing system of Example 10, wherein the plurality of string drivers comprise c-axis aligned crystalline indium gallium zinc oxide (CAAC-IGZO) transistors.

Example 14 includes the computing system of Example 10, wherein the plurality of string drivers comprise wideband transistors.

Example 15 includes the computing system of any of Examples 10 to 14, wherein the computing system is a mobile computing device.

Example 16 is a method, comprising: forming a plurality of wordlines of a memory device, the wordlines comprising a stack of multiple tiers in a die, the forming including disposing a semiconductor layer on top of the plurality of wordlines; and disposing a plurality of string drivers in the semiconductor layer substantially perpendicular to the tier stack of the plurality of wordlines, including providing respective gate connections for the plurality of string drivers in the semiconductor layer.

Example 17 includes the method of Example 16, wherein the disposing a semiconductor layer on top of the plurality of wordlines includes providing a thickness of the semiconductor layer, to integrate the plurality of string drivers in the semiconductor layer.

Example 18 includes the method of Example 16, wherein the disposing a semiconductor layer on top of the plurality of wordlines includes forming a select gate drain (SGD) layer for the plurality of wordlines.

Example 19 includes the method of any of Examples 16 to 18, wherein the plurality of string drivers comprise wideband transistors.

Example 20 includes the method of claim 19, further comprising: providing routing connections for the plurality of string drivers, including connecting respective gates of the string drivers with respective routing lines.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. An apparatus, comprising:
a plurality of wordlines formed in a stack of multiple tiers;
a first semiconductor layer that comprises a select gate drain (SGD) layer and is disposed on top of the plurality of wordlines, wherein the first semiconductor layer includes polysilicon;
a second semiconductor layer that comprises a common source line and is disposed underneath the plurality of wordlines; and
a plurality of string drivers disposed in the first semiconductor layer substantially perpendicular to the tier stack of the plurality of wordlines, to connect with the common source line, wherein the first semiconductor layer provides respective gate connections for the plurality of string drivers.

2. The apparatus of claim 1, wherein the plurality of string drivers comprise c-axis aligned crystalline indium gallium zinc oxide (CAAC-IGZO) transistors.

3. The apparatus of claim 1, wherein the plurality of string drivers comprise wideband transistors.

4. The apparatus of claim 1, wherein the apparatus is provided according to a complementary metal-oxide-semiconductor (CMOS) under array circuitry (CUA).

5. The apparatus of claim 1, wherein routing connections for the plurality of string drivers are disposed on top of respective contacts for the plurality of wordlines.

6. The apparatus of claim 1, wherein the apparatus comprises a three-dimensional (3D) NAND memory array.

7. The apparatus of claim 1, wherein the apparatus comprises an integrated circuit.

8. A computing system, comprising:
a processor; and
a memory coupled with the processor, wherein the memory includes:
a plurality of wordlines formed in a stack of multiple tiers;
a first semiconductor layer that comprises a select gate drain (SGD) layer and is disposed on top of the plurality of wordlines, wherein the first semiconductor layer includes polysilicon;
a second semiconductor layer that comprises a common source line and is disposed underneath the plurality of wordlines; and
a plurality of string drivers disposed in the first semiconductor layer substantially perpendicular to the tier stack of the plurality of wordlines, wherein the first semiconductor layer provides respective gate connections for the plurality of string drivers.

9. The computing system of claim 8, wherein the plurality of string drivers comprise c-axis aligned crystalline indium gallium zinc oxide (CAAC-IGZO) transistors.

10. The computing system of claim 8, wherein the plurality of string drivers comprise wideband transistors.

11. The computing system of claim 8, wherein the computing system is a mobile computing device.

12. A method, comprising:
forming a plurality of wordlines of a memory device, the wordlines comprising a stack of multiple tiers in a die,
disposing a first semiconductor layer on top of the plurality of wordlines, wherein the first semiconductor layer comprises a select gate drain (SGD) layer and includes polysilicon;
disposing a second semiconductor layer underneath the plurality of wordlines, wherein the second semiconductor layer comprises a common source line; and
disposing a plurality of string drivers in the first semiconductor layer substantially perpendicular to the tier stack of the plurality of wordlines, including providing respective gate connections for the plurality of string drivers in the first semiconductor layer.

13. The method of claim 12, wherein the disposing of a first semiconductor layer on top of the plurality of wordlines includes providing a thickness of the first semiconductor layer, to integrate the plurality of string drivers in the first semiconductor layer.

14. The method of claim 12, wherein the plurality of string drivers comprise wideband transistors.

15. The method of claim 14, further comprising: providing routing connections for the plurality of string drivers, including connecting respective gates of the string drivers with respective routing lines.

\* \* \* \* \*